US012750957B2

(12) United States Patent
Wang et al.

(10) Patent No.: US 12,750,957 B2
(45) Date of Patent: Sep. 29, 2026

(54) CIRCUIT BOARD AND MANUFACTURING METHOD THEREOF

(71) Applicants: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei CIty (TW)

(72) Inventors: Jia-Hui Wang, Hebei Province (CN); Yue Liu, Hebei Province (CN); Yuan-Yu Lin, Hebei Province (CN); Yue Han, Hebei Province (CN)

(73) Assignees: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei City (TW)

( * ) Notice: Subject to any disclaimer, the term of this patent is extended or adjusted under 35 U.S.C. 154(b) by 331 days.

(21) Appl. No.: 18/671,592

(22) Filed: May 22, 2024

(65) Prior Publication Data

US 2025/0365872 A1 Nov. 27, 2025

(51) Int. Cl.
*H05K 3/46* (2006.01)
*H05K 1/03* (2006.01)

(52) U.S. Cl.
CPC ......... *H05K 3/4644* (2013.01); *H05K 1/0306* (2013.01); *H05K 2201/10015* (2013.01); *H05K 2203/1194* (2013.01)

(58) Field of Classification Search
CPC .. H05K 1/0306; H05K 3/4644; H05K 3/4038; H05K 3/4605; H05K 2201/10015;
(Continued)

(56) References Cited

U.S. PATENT DOCUMENTS 7,553,738 B2 * 6/2009 Min ....................... H05K 1/162 257/532
8,058,568 B2 * 11/2011 Chang .................. H05K 3/4602 174/258
(Continued)

FOREIGN PATENT DOCUMENTS

CN 106105405 A 11/2016
CN 103716985 B 1/2017
(Continued)

*Primary Examiner* — Angel R Estrada
(74) *Attorney, Agent, or Firm* — MUNCY, GEISSLER, OLDS & LOWE, P.C.

(57) ABSTRACT

A circuit board includes a glass substrate, a wiring layer, an electronic component, a first build-up structure and a second build-up structure. The glass substrate has a first surface, a second surface opposite to the first surface, and a conductive through hole connecting to the first surface and the second surface. The melting point of the glass substrate is not greater than 600° C. and is greater than the temperature of soldering. The wiring layer and the electronic component are disposed in the glass substrate. The first layer build-up structure is disposed on the first surface and is electrically connected to the conductive through hole. The second build-up structure is disposed on the second surface and is electrically connected to the conductive through hole.

17 Claims, 5 Drawing Sheets

10

(58) Field of Classification Search
CPC ......... H05K 2203/1194; H05K 1/0298; H05K 1/115; H05K 2201/096; H05K 1/02; H05K 3/38; H05K 1/11; H05K 3/3473; H05K 3/384; H05K 3/385; H05K 2203/0307; H10W 70/685; H10W 70/66; H10W 74/10; H10W 90/00
USPC ................ 174/255, 250, 256, 260, 263, 258
See application file for complete search history.

(56) References Cited

U.S. PATENT DOCUMENTS

| | | | | |
|---|---|---|---|---|
| 8,069,560 | B2 * | 12/2011 | Mori | H05K 3/4605 29/852 |
| 8,101,868 | B2 * | 1/2012 | Ito | H05K 1/185 174/262 |
| 8,207,453 | B2 * | 6/2012 | Ma | H05K 1/112 174/265 |
| 9,006,580 | B2 * | 4/2015 | Maeda | H05K 1/0269 29/846 |
| 9,089,082 | B2 * | 7/2015 | Hsu | H05K 1/186 |
| 10,561,017 | B1 * | 2/2020 | Fu | H05K 3/4682 |
| 12,477,656 | B2 * | 11/2025 | Shin | H05K 1/0298 |
| 2017/0098631 | A1 | 4/2017 | Kikuchi et al. | |

FOREIGN PATENT DOCUMENTS

| | | | |
|---|---|---|---|
| CN | 116982417 | A | 10/2023 |
| TW | 200704327 | A | 1/2007 |
| TW | 202023329 | A | 6/2020 |

* cited by examiner

CIRCUIT BOARD AND MANUFACTURING METHOD THEREOF

BACKGROUND

Field of Invention

The present disclosure relates to a circuit board and a method of manufacturing the same. More particularly, the present disclosure relates to a circuit board including a glass substrate and a method of manufacturing the same.

Description of Related Art

Glass substrates have good chemical stability, thermal stability, high flatness and high mechanical strength, so they are one of the choices for circuit board applications. However, most of the ways of making conductive through holes in glass substrates to realize electrical connection or making openings for embedding components often have problems such as large aperture diameters and easy to cause cracks or breakage. In addition, the trend of embedded components and miniaturization of circuit boards increases the technical difficulty of applying glass substrates to circuit boards, which in turn leads to a decrease in product yield.

SUMMARY

At least one embodiment of the present disclosure provides a circuit board including a glass substrate that can improve product yield.

At least another embodiment of the present disclosure provides a method of manufacturing the abovementioned circuit board to help improve the product yield of the abovementioned circuit board.

The circuit board according to at least one embodiment of the present disclosure includes a glass substrate, a wiring layer, an electronic component, a first build-up structure and a second build-up structure. The glass substrate has a first surface, a second surface opposite to the first surface, and a conductive through hole connecting to the first surface and the second surface, where the melting point of the glass substrate is not greater than 600° C. and is greater than the temperature of soldering. The wiring layer is disposed in the glass substrate, and the electronic component is disposed in the glass substrate. The first build-up structure is disposed on the first surface and is electrically connected to the conductive through hole, and the second build-up structure is disposed on the second surface and is electrically connected to the conductive through hole.

The method of manufacturing the circuit board according to at least another embodiment of the present disclosure includes the following steps. A first wiring layer is formed on a release substrate. The release substrate is disposed in a first mold after the first wiring layer is formed on the release substrate. The first mold is filled with a first molten glass material after the release substrate is disposed in the first mold. The first molten glass material is annealed to form an initial glass substrate. The first mold is removed after the first molten glass material is annealed to form the initial glass substrate. A second wiring layer is formed on the initial glass substrate. An electronic component is mounted on the second wiring layer after the second wiring layer is formed on the initial glass substrate. The release substrate and the initial glass substrate are disposed in a second mold after the electronic component is mounted on the second wiring layer. The second mold is filled with a second molten glass material after the release substrate and the initial glass substrate are disposed in the second mold. The second molten glass material is annealed to form the glass substrate, where the melting point of the glass substrate is greater than the temperature of soldering. The second mold and the release substrate are removed after the second molten glass material is annealed to form the glass substrate.

It is to be understood that both the foregoing general description and the following detailed description are by examples, and are intended to provide further explanation of the present disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
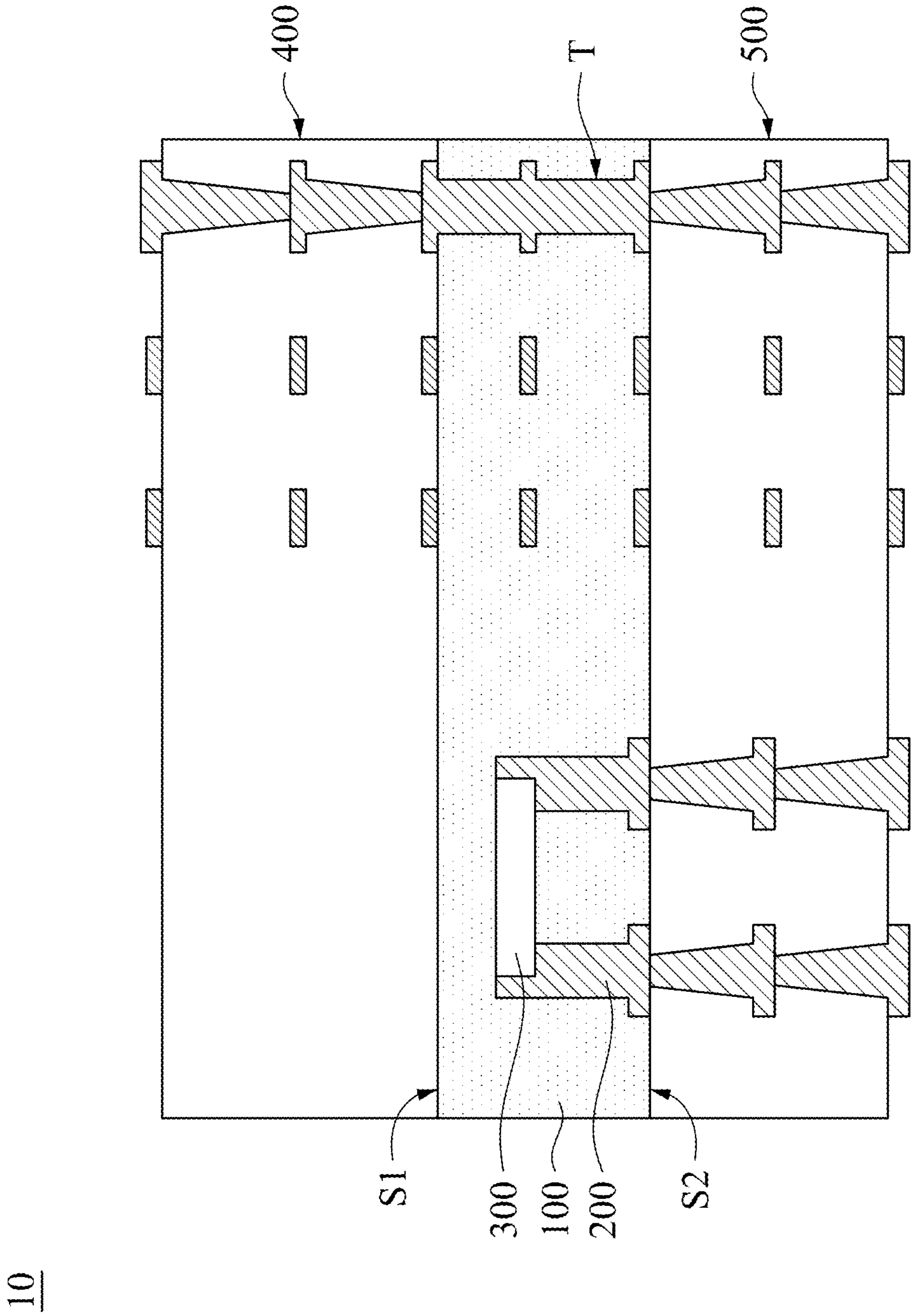
FIG. 1 is a partial schematic cross-sectional view of a circuit board according to at least one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unequal proportions. Therefore, the description and explanation of the following embodiments are not limited to the sizes and shapes presented by the elements in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case are mainly for illustration, and are not intended to accurately depict the actual shape of the elements, nor are they intended to limit the scope of patent applications in this case.

Furthermore, the words "about", "approximately" or "substantially" used in the present disclosure not only cover the clearly stated numerical values and numerical ranges, but also cover those that can be understood by a person with ordinary knowledge in the technical field to which the present disclosure belongs. The permissible deviation range can be determined by the error generated during measurement, and the error is caused, for example, by limitations of the measurement system or process conditions. For example, two objects (such as the plane or traces of a substrate) are "substantially parallel" or "substantially perpendicular," where "substantially parallel" and "substantially perpendicular," respectively, mean that parallelism and perpendicularity between the two objects can include non-parallelism and non-perpendicularity caused by permissible deviation ranges.

The spatial relative terms used in the present disclosure, such as "below," "under," "above," "on," and the like, are intended to facilitate the recitation of a relative relationship between one element or feature and another as depicted in the figures. The true meaning of these spatial relative terms includes other orientations. For example, the relationship between one element and another may change from "below" and "under" to "above" and "on" when the figure is turned 180 degrees up or down. In addition, spatially relative descriptions used in the present disclosure should be interpreted in the same manner.

It should be understood that while the present disclosure may use terms such as "first", "second", "third", etc. to describe various elements or features, these elements or features should not be limited by these terms. These terms are primarily used to distinguish one element from another, or one feature from another. In addition, the term "or" as used in the present disclosure may include, as appropriate, any one or a combination of the listed items in association.

Although a series of operations or steps are used to illustrate the manufacturing method in the present disclosure, the order shown in these operations or steps should not be construed as a limitation of the present disclosure. For example, some operations or steps may be performed in a different order and/or concurrently with other steps. In addition, each operation or step described herein may include several sub-steps or actions.

Moreover, the present disclosure may be implemented or applied in various other specific embodiments, and the details of the present disclosure may be combined, modified, and altered in various embodiments based on different viewpoints and applications, without departing from the idea of the present disclosure.

FIG. 1 is a partial schematic cross-sectional view of a circuit board according to at least one embodiment of the present disclosure. Referring to FIG. 1, the circuit board 10 includes a glass substrate 100, a wiring layer 200, an electronic component 300, a first build-up structure 400 and a second build-up structure 500. The glass substrate has a first surface S1, a second surface S2 opposite to the first surface S1, and a conductive through hole T connecting to the first surface S1 and the second surface S2. The melting point of the glass substrate 100 is not greater than 600° C.

The wiring layer 200 is disposed in the glass substrate 100, and the electronic component 300 is disposed in the glass substrate 100. The first build-up structure 400 is disposed on the first surface S1 and is electrically connected to the conductive through hole T, and the second build-up structure 500 is disposed on the second surface S2 and is electrically connected to the conductive through hole T.

By using a glass material with a lower melting point, the molten glass material can be formed on the wiring layer 200 and cover the electronic component 300 after the wiring layer 200 is formed, and then the glass substrate with the melting point not greater than 600° C. is formed after annealing. Therefore, the glass substrate does not need to be etched, machined, or laser drilled to form conductive through holes for electrical connections or openings for embedded components, thereby avoiding cracks or breakage in the glass substrate and improving product yield.

In some embodiments, the melting point of the glass substrate 100 is greater than the temperature of soldering. For example, the melting point of the glass substrate 100 is not less than 220° C. The material of the glass substrate 100 may include lead glass, the melting point of which is, for example, 530° C. The melting point of the wiring layer 200 is not less than 1000° C., and the material of the wiring layer 200 may include copper or other metal alloy. The electronic component 300 may include a passive component, such as a capacitor or a resistor, and the material of the passive component may include a high-temperature resistant material, such as glass glaze.

Through the above material selection, the annealing temperature of the glass substrate 100 is not too high, which can avoid affecting the wiring layer 200 and the electronic component 300, thereby improving the product yield. In addition, the conductive through hole T may include a conductive pillar. The first build-up structure 400 and the second build-up structure 500 may include ajinomoto build-up film (ABF).

For example, the thickness of the glass substrate 100 is about 40 microns. The depth of the conductive through hole T is about greater than 40 microns. The line/space ratio (L/S) of the wiring layer 200 is about greater than 30/30 microns. The thickness the electronic component 300 is not greater than 12 microns, for example, it can be 8 to 12 microns, but is not limited thereto. In addition, the glass substrate 100 can be applied to a ball grid array (BGA) package or an embedded multi-die interconnect bridge (EMIB) package, but is not limited thereto.

Figure 2A:
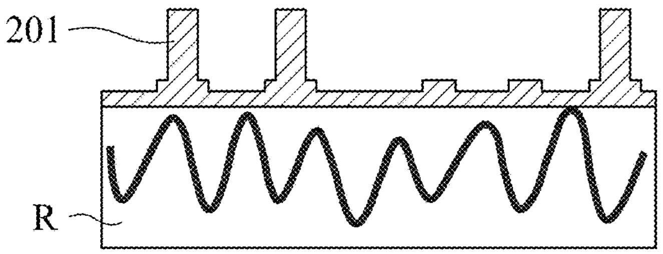
FIGS. 2A to 2I are partial schematic cross-sectional views of a method of manufacturing the circuit board in FIG. 1.

FIGS. 2A to 2I are partial schematic cross-sectional views of a method of manufacturing the circuit board in FIG. 1. Referring to FIG. 2A, a first wiring layer 201 is formed on the release substrate R. In some embodiments, the release substrate R may include a peelable copper foil.

Figure 2B:
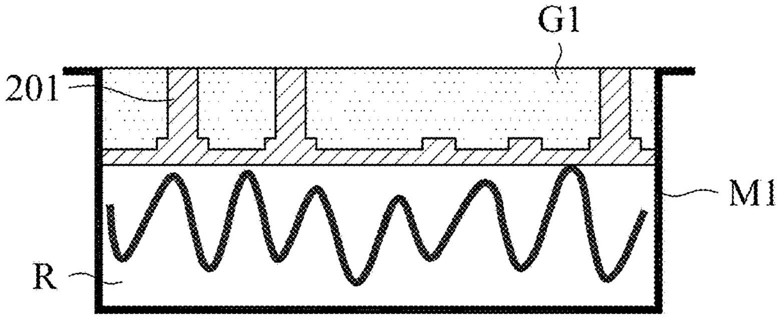

Referring to FIG. 2B, the release substrate R is disposed in a first mold M1 after the first wiring layer 201 is formed on the release substrate R. The first mold M1 is filled with a first molten glass material G1 after the release substrate R is disposed in the first mold M1.

Figure 2C:
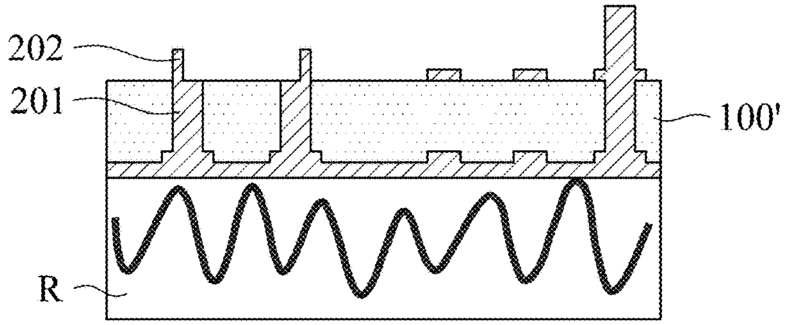

Referring to FIG. 2C, the first molten glass material G1 is annealed to form an initial glass substrate 100'. The first mold M1 is removed after the first molten glass material G1 is annealed to form the initial glass substrate 100'. The second wiring layer 202 is formed on the initial glass substrate 100'. In some embodiments, the materials of the first wiring layer 201 and the second wiring layer 202 may include metal, such as copper. The first wiring layer 201 and the second wiring layer 202 may be formed by an electroplating process.

Figure 2D:
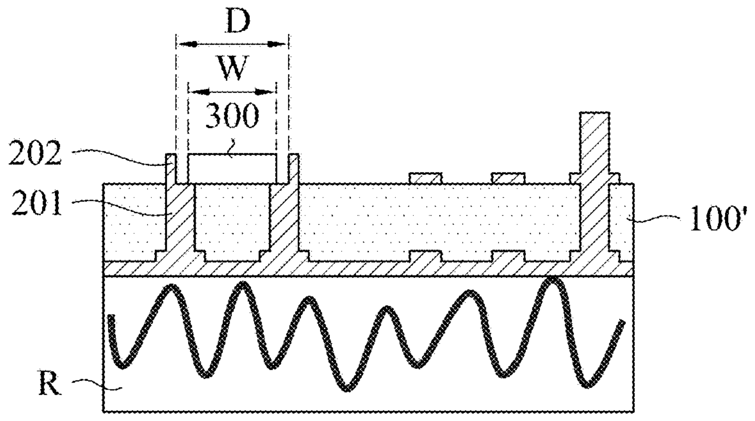
Figure 2E:
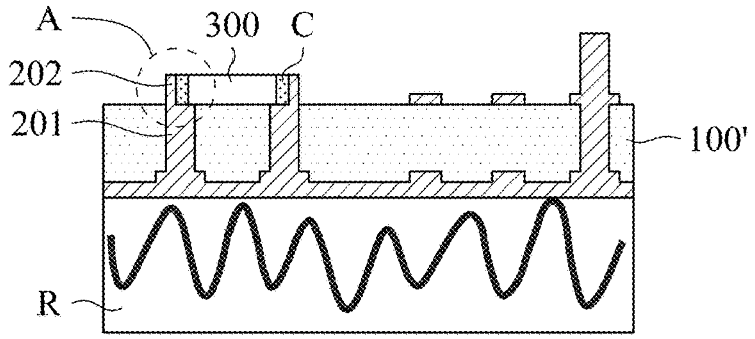

Referring to FIG. 2D and FIG. 2E, the electronic component 300 is mounted on the second wiring layer 202 after the second wiring layer 202 is formed on the initial glass substrate 100'. In some embodiments, the step of mounting the electronic component 300 on the second wiring layer 202 includes forming the electrical connection material C between the electronic component 300 and the second wiring layer 202 and curing the electrical connection material C.

Figure 3:
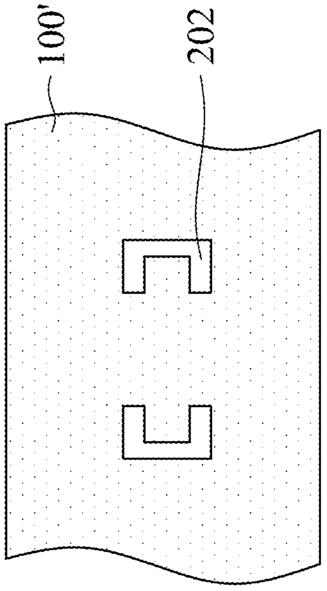
FIG. 3 is a partial schematic top view of FIG. 2C.

FIG. 3 is a partial schematic top view of FIG. 2C. Referring to FIG. 3, the top view shape of the second wiring layer 202 corresponding to the position of the electronic element 300 are two U-shape with openings opposite to each other. In FIG. 20, the sectional view of the second wiring layer 202 is a metal wall with a height, which prevents the electronic element 300 from deflecting when the second molten glass material G2 is formed. In addition, as shown in FIG. 2D, the pitch D of the aforementioned metal wall is greater than the width W of the electronic element 300, so there is a gap between the aforementioned metal wall and the electronic element 300.

Figure 4:
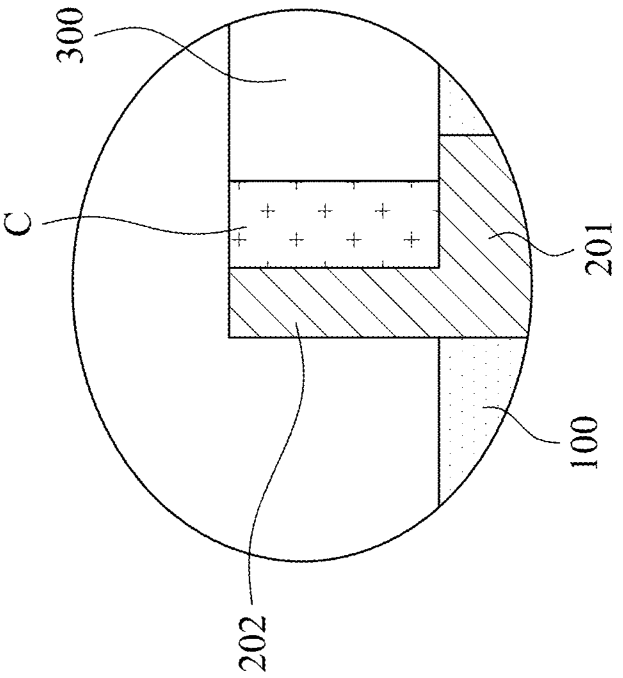
FIG. 4 is an enlarged schematic view of an area A in FIG. 2E.

FIG. 4 is an enlarged schematic view of an area A in FIG. 2E. In detail, as shown in FIG. 4, the electrical connection material C is formed in the abovementioned gap, and the electrical connection material C is cured. In some embodiments, the electrical connection material C may include metal, such as copper paste. The temperature for curing the electrical connection material C may be 180° C. to 220° C., and the time for curing the electrical connection material C may be 5 minutes to 30 minutes.

Figure 2F:
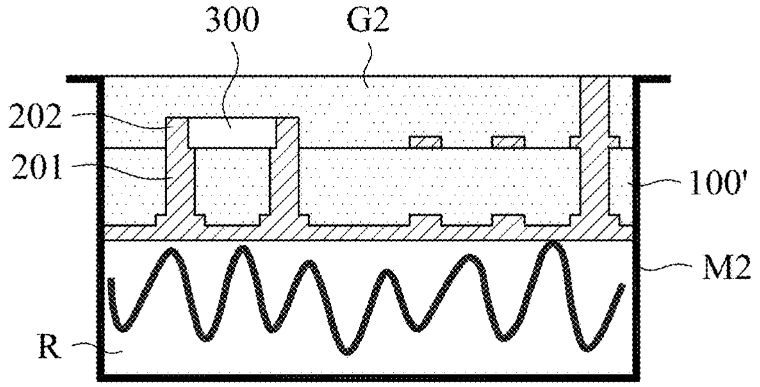

Referring to FIG. 2F, the release substrate R and the initial glass substrate 100' are disposed in the second mold M2 after the electronic component 300 is mounted on the second wiring layer 202. The second mold M2 is filled with a second molten glass material G2 after the release substrate R and the initial glass substrate 100' are disposed in the second mold M2.

Figure 2G:
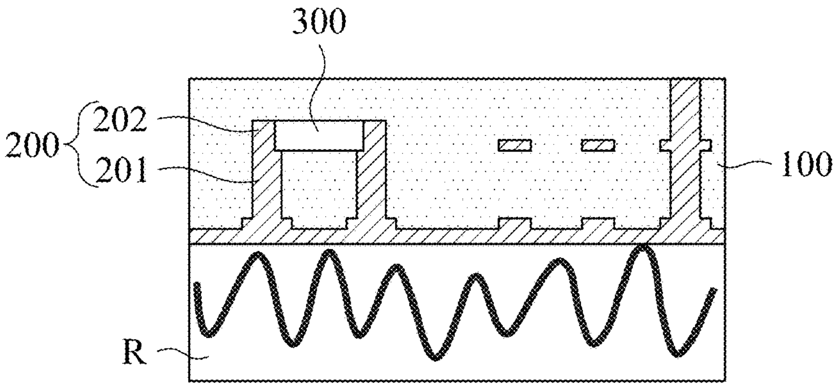

Referring to FIG. 2G, the second molten glass material G2 is annealed to form the glass substrate 100. The glass substrate 100 includes the initial glass substrate 100', and the wiring layer 200 includes the first wiring layer 201 and the second wiring layer 202. In some embodiments, the melting point of the glass substrate 100 is greater than the temperature of soldering, and the first molten glass material G1 and the second molten glass material G2 may include glass material with melting point not greater than 600° C., such as lead glass material with melting point of 530° C.

The temperature for annealing the first molten glass material G1 to form the initial glass substrate 100' and the temperature for annealing the second molten glass material G2 to form the glass substrate 100 are 500° C. to 600° C. The time for annealing the first molten glass material G1 to form the initial glass substrate 100' and the time for annealing the second molten glass material G2 to form the glass substrate 100 are 30 minutes to 60 minutes. The cooling rate after the first molten glass material G1 is annealed to form the initial glass substrate 100' and the cooling rate after the second molten glass material G2 is annealed to form the glass substrate 100 are 5° C. to 10° C. per hour. The aforementioned annealing process conditions can be applied to form thinner substrates, and the annealing process is to anneal the entire surface and keep it flat to avoid bending or deformation caused by gravity.

Figure 2H:
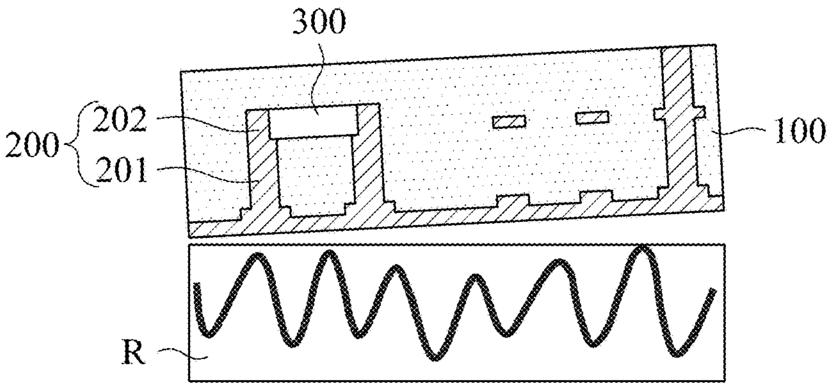
Figure 2I:
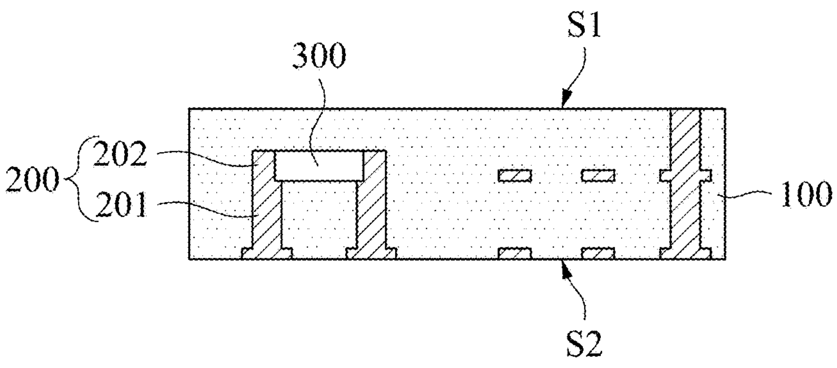

Referring to FIG. 2H and FIG. 2I, the second mold M2 and the release substrate R are removed after the second molten glass material G2 is annealed to form the glass substrate 100. The glass substrate 100 has the first surface S1 and the second surface S2 opposite to the first surface S1.

Next, the first build-up structure 400 and the second build-up structure 500 are respectively formed on the first surface S1 and the second surface S2 of the glass substrate 100 after the second mold M2 and the release substrate R are removed, as shown in FIG. 1.

In addition, polishing, such as chemical-mechanical polishing (CMP), can be performed after the first mold M1, the second mold M2, and the release substrate R are removed, respectively. In some embodiments, the thickness of the initial glass substrate 100' may be 20 microns after the first mold M1 is removed and polishing is performed. The thickness of the glass substrate 100 may be 40 microns after the second mold M2 and the release substrate R are removed and polishing is performed.

In summary, in the abovementioned circuit board and its manufacturing method in at least one embodiment of the present disclosure, by using a glass material with a lower melting point, the molten glass material can be formed on the wiring layer and cover the electronic component after the wiring layer is formed, and then the glass substrate is formed after annealing. Therefore, the glass substrate does not need to be etched, machined, or laser drilled to form conductive through holes for electrical connections or openings for embedded components, thereby avoiding cracks or breakage in the glass substrate and improving product yield.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A circuit board, comprising:

a glass substrate, having a first surface, a second surface opposite to the first surface, and a conductive through hole connecting to the first surface and the second surface, wherein a melting point of the glass substrate is not greater than 600° C. and is greater than a temperature of soldering;

a wiring layer, disposed in the glass substrate;

an electronic component, disposed in the glass substrate;

a first build-up structure, disposed on the first surface and electrically connected to the conductive through hole; and a second build-up structure, disposed on the second surface and electrically connected to the conductive through hole.

2. The circuit board of claim 1, wherein a material of the glass substrate comprises lead glass.

3. The circuit board of claim 1, wherein a melting point of the wiring layer is not less than 1000° C.

4. The circuit board of claim 1, wherein the electronic component comprises a passive component.

5. The circuit board of claim 4, wherein a material of the passive component comprises glass glaze.

6. The circuit board of claim 4, wherein the passive component comprises a capacitor.

7. The circuit board of claim 1, wherein a thickness of the electronic component is not greater than 12 microns.

8. The circuit board of claim 7, wherein the thickness of the electronic component is 8 microns to 12 microns.

9. The circuit board of claim 1, wherein the melting point of the glass substrate is not less than 220° C.

10. A method of manufacturing a circuit board, comprising:

forming a first wiring layer on a release substrate;

disposing the release substrate in a first mold after the first wiring layer is formed on the release substrate;

filling the first mold with a first molten glass material after the release substrate is disposed in the first mold;

annealing the first molten glass material to form an initial glass substrate;

removing the first mold after the first molten glass material is annealed to form the initial glass substrate;

forming a second wiring layer on the initial glass substrate;

mounting an electronic component on the second wiring layer after the second wiring layer is formed on the initial glass substrate;

disposing the release substrate and the initial glass substrate in a second mold after the electronic component is mounted on the second wiring layer;

filling the second mold with a second molten glass material after the release substrate and the initial glass substrate are disposed in the second mold;

annealing the second molten glass material to form a glass substrate, wherein a melting point of the glass substrate is greater than a temperature of soldering; and removing the second mold and the release substrate after the second molten glass material is annealed to form the glass substrate.

11. The method of manufacturing the circuit board of claim 10, further comprises:

forming a first build-up structure on a first surface of the glass substrate and a second build-up structure on a second surface of the glass substrate opposite the first surface after the second mold and the release substrate are removed.

12. The method of manufacturing the circuit board of claim 10, wherein a temperature for annealing the first molten glass material to form the initial glass substrate and a temperature for annealing the second molten glass material to form the glass substrate are 500° C. to 600° C.

13. The method of manufacturing the circuit board of claim 10, wherein a time for annealing the first molten glass material to form the initial glass substrate and a time for annealing the second molten glass material to form the glass substrate are 30 minutes to 60 minutes.

14. The method of manufacturing the circuit board of claim 10, wherein a cooling rate after the first molten glass material is annealed to form the initial glass substrate and a cooling rate after the second molten glass material is annealed to form the glass substrate are 5° C. to 10° C. per hour.

15. The method of manufacturing the circuit board of claim 10, wherein the step of mounting the electronic component on the second wiring layer comprises:

forming an electrical connection material between the electronic component and the second wiring layer; and curing the electrical connection material.

16. The method of manufacturing the circuit board of claim 15, wherein a temperature for curing the electrical connection material is 180° C. to 220° C.

17. The method of manufacturing the circuit board of claim 15, wherein a time for curing the electrical connection material is 5 minutes to 30 minutes.

* * * * *